United States Patent
Heyberger et al.

(10) Patent No.: US 11,845,105 B2
(45) Date of Patent: Dec. 19, 2023

(54) SOFT PLASMA POLYMERIZATION PROCESS FOR A MECHANICALLY DURABLE SUPERHYDROPHOBIC NANOSTRUCTURED COATING

(71) Applicant: MOLECULAR PLASMA GROUP SA, Foetz (LU)

(72) Inventors: Régis Heyberger, Thionville (FR); Gill Scheltjens, Boom (BE)

(73) Assignee: MOLECULAR PLASMA GROUP SA, Foetz (LU)

( * ) Notice: Subject to any disclaimer, the term of this patent is extended or adjusted under 35 U.S.C. 154(b) by 599 days.

(21) Appl. No.: 16/640,103

(22) PCT Filed: Aug. 23, 2018

(86) PCT No.: PCT/EP2018/072762
§ 371 (c)(1),
(2) Date: Feb. 19, 2020

(87) PCT Pub. No.: WO2019/038378
PCT Pub. Date: Feb. 28, 2019

(65) Prior Publication Data
US 2021/0086226 A1    Mar. 25, 2021

(30) Foreign Application Priority Data
Aug. 23, 2017  (EP) .................... 17187416

(51) Int. Cl.
*B05D 1/00* (2006.01)
*B05D 1/34* (2006.01)
(Continued)

(52) U.S. Cl.
CPC ............. *B05D 1/62* (2013.01); *B05D 1/34* (2013.01); *C09D 133/16* (2013.01); *C09D 183/04* (2013.01)

(58) Field of Classification Search
None
See application file for complete search history.

(56) References Cited

U.S. PATENT DOCUMENTS

| | | |
|---|---|---|
| 7,455,892 B2 | 11/2008 | Goodwin et al. |
| 8,178,168 B2 | 5/2012 | O'Neill et al. |
| (Continued) | | |

FOREIGN PATENT DOCUMENTS

| | | |
|---|---|---|
| CN | 101048237 A | 10/2007 |
| CN | 103468835 A | 12/2013 |
| (Continued) | | |

OTHER PUBLICATIONS

Office Action from corresponding EP Application No. 17187416.7, dated Jul. 23, 2020.
Kang et al., "Analysis of Polymer Characteristics Using Matrix-assisted Laser Desorption/Ionization Time-of-flight Mass Spectrometry," Journal of Applied Chemistry Eng., vol. 28, No. 3. Jun. 1, 2017, pp. 263-271. Accessed from https://www.KoreaScience.or.kr on Apr. 12, 2022.
(Continued)

*Primary Examiner* — Shamim Ahmed
*Assistant Examiner* — Bradford M Gates
(74) *Attorney, Agent, or Firm* — WORKMAN NYDEGGER

(57) ABSTRACT

A method for depositing a coating on a substrate is disclosed. A first precursor comprising fluoro-acrylate monomers, fluoro-alkyl acrylate monomers, fluoro-methacrylate monomers, fluoro-alkyl methacrylate monomers, fluoro-silane monomers, or a combination or derivates thereof is provided. A second precursor comprising linear siloxanes, silane monomers, cyclosiloxanes, cyclosilane monomers, or a combination or derivates thereof is provided. The first and second precursors are co-injected in a treatment region. An atmospheric or reduced pressure plasma discharge is created in said treatment region. The substrate coating comprises alternated multi-stacked nanostructures and is formed by copolymerization of the first and second precursors.

13 Claims, 5 Drawing Sheets

(51) Int. Cl.
*C09D 133/16* (2006.01)
*C09D 183/04* (2006.01)

(56) References Cited

U.S. PATENT DOCUMENTS

| | | | |
|---|---|---|---|
| 10,471,465 | B2 | 11/2019 | Boscher et al. |
| 2004/0022945 | A1 | 2/2004 | Goodwin et al. |
| 2005/0158480 | A1* | 7/2005 | Goodwin ............... C23C 4/123 427/569 |
| 2005/0178330 | A1 | 8/2005 | Goodwin et al. |
| 2007/0202270 | A1 | 8/2007 | Rose et al. |
| 2009/0065485 | A1 | 3/2009 | O'Neill et al. |
| 2009/0142514 | A1 | 6/2009 | O'Neill et al. |
| 2009/0202739 | A1 | 8/2009 | O'Neill et al. |
| 2013/0040102 | A1 | 2/2013 | Gleason et al. |
| 2014/0042130 | A1 | 2/2014 | Descamps et al. |
| 2014/0322455 | A1 | 10/2014 | Im et al. |
| 2015/0044444 | A1* | 2/2015 | Gell ..................... C23C 4/10 415/230 |
| 2015/0232688 | A1 | 8/2015 | Legein et al. |
| 2017/0050214 | A1 | 2/2017 | Boscher et al. |

FOREIGN PATENT DOCUMENTS

| | | |
|---|---|---|
| EA | 006831 B1 | 4/2006 |
| EA | 008013 B1 | 2/2007 |
| EA | 010367 B1 | 8/2008 |
| JP | 2008519411 A | 6/2008 |
| JP | 2015537110 A | 12/2015 |
| JP | 2017526518 A | 9/2017 |
| WO | 03086030 A1 | 10/2003 |
| WO | 2005039753 A1 | 5/2005 |
| WO | 2013113875 A1 | 8/2013 |
| WO | 2015169864 A1 | 11/2015 |
| WO | 2015183555 A2 | 12/2015 |
| WO | 2016198857 A1 | 12/2016 |
| WO | 2017051019 A1 | 3/2017 |

OTHER PUBLICATIONS

Moskvichev Yu.A et al., Theoretical Foundations of Chemical Technology, Textbook, 2016, p. 6, 2nd edition, revised, St. Petersburg, Publishing House "Lan."

Russian Office Action from Corresponding Russian Application RU2020104449, dated Feb. 28, 2022.

Office Action from corresponding Japanese Application No. 2020-531817, dated Aug. 30, 2022.

Decision on Rejection from corresponding Chinese Application No. 201880054315.0, dated Aug. 1, 2022.

Office Action from corresponding European Application No. 17187416.7, dated Mar. 11, 2022.

Office Action from corresponding Chinese Application No. 201880054315.0, dated Jan. 10, 2022.

Anthony et al., "Soft Plasma Polymerization of Gas State Precursors from an Atmospheric Pressure Corona Plasma Discharge," Chemistry of Materials, vol. 21, 2009, pp. 4401-4407.

Gupta et al., "Initiated Chemical Vapor Deposition of Poly(1H,1H,2H,2H-perfluorodecyl Acrylate) Thin Films," Langmuir, vol. 22, 2006, pp. 10047-10052.

Kumar et al., "Flurocarbon Coatings Via Plasma Enhanced Chemical Vapor Deposition of 1H,1H,2H,2H-perfluorodecyl Acrylate-2, Morphology, Wettability and Antifouling Characterization," Plasma Processes and Polymers, vol. 7, 2010, pp. 926-938.

European Search Report from Application No. EP17187416.7, dated Feb. 21, 2018.

International Search Report and Written Opinion from Application No. PCT/EP2018/072762, dated Nov. 23, 2018.

Russian Office Action in corresponding Russian Application No. 2020104449, dated Aug. 26, 2022.

Japanese Office Action in corresponding Japanese Application No. 2020-531817, dated Aug. 30, 2022.

Thomas, Practical Guide to ICP-MS: A tutorial for beginners, Third Edition, 2013, p. 9, CRC Press, Boca Raton, Florida.

\* cited by examiner

Fig. 1
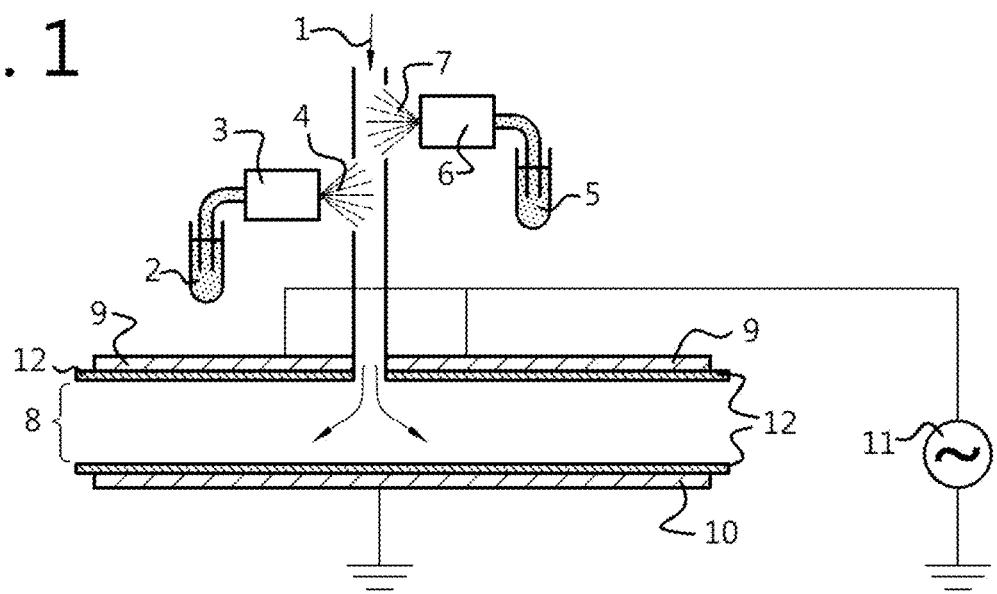
Fig. 2 - Prior Art -
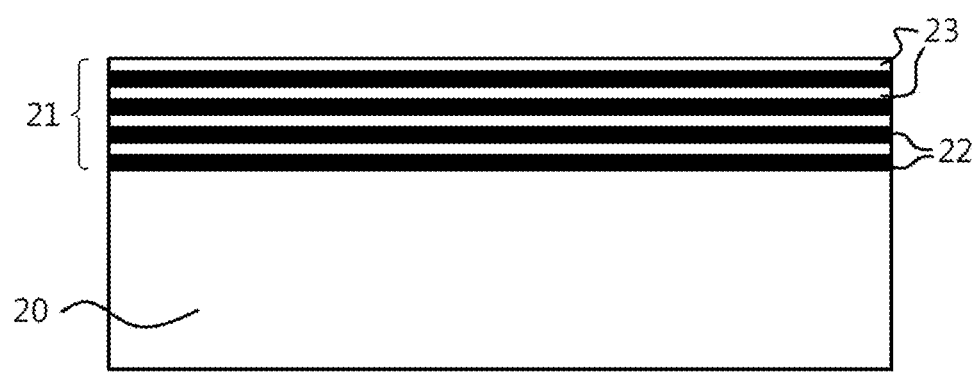

SOFT PLASMA POLYMERIZATION PROCESS FOR A MECHANICALLY DURABLE SUPERHYDROPHOBIC NANOSTRUCTURED COATING

TECHNICAL FIELD

The invention pertains to the technical field of atmospheric pressure or reduced pressure plasma polymerization processes for the deposition of superhydrophobic coatings.

BACKGROUND

Surfaces with high water repellency are called superhydrophobic. Some biological species have surfaces with superhydrophobic properties such as, for example, mosquito's eyes, water strider and lotus leafs.

Kumar et al., Plasma Processes and Polymers 7, 926-938 (2010) discloses the preparation of low surface energy coatings via plasma enhanced chemical vapor deposition of 1H,1H,2H,2H-perfluorodecyl acrylate (PFDA) in a low pressure inductively excited radiofrequency plasma. Gupta et al., Langmuir 22(24), 10047-10052 (2006) discloses the preparation of low surface energy poly-PFDA coatings via initiated chemical vapor deposition. Anthony et al., Chemistry of Materials 21, 4401-4403 (2009) discloses the preparation of low surface energy coatings via corona discharge using 1H,1H,2H,2H-heptadecafluorodecyl acrylate. Unfortunately, the water contact angle of these coatings is rather low, i.e. around 120°. It is assumed that that a low roughness achieved by these deposition methods triggers this low water contact angle.

WO 2013/113875 discloses a method for producing a superamphiphobic coating on a substrate comprising generating a plasma in a treatment space under atmospheric pressure, using a dielectric barrier discharge; and introducing into said plasma a coating forming material selected from the group consisting of fluoro-acrylate monomers, fluoro-alkyl acrylate monomers, fluoro-methacrylate monomers, fluoro-alkyl methacrylate monomers, fluoro-silane monomers or a combination thereof.

US 2004/0022945 discloses a method for forming a coating on a substrate using an atmospheric pressure plasma discharge. The method comprises introducing an atomized liquid and/or solid coating-forming material into an atmospheric pressure plasma discharge and/or an ionized gas stream resulting therefrom, and exposing the substrate to the atomized coating forming material. The document also describes a method for polymerizing a polymer forming material, and an apparatus for forming a coating on a substrate.

US 2007/0202270 discloses a method and an apparatus for coating a substrate with an inorganic-organic hybrid polymer material. The method generates and maintains a plasma according to the dielectric barrier discharge technique. The method includes the steps of introducing a sample in the space between two electrodes, generating a plasma discharge between the electrodes and admixing aerosols containing hybrid organic/inorganic cross-linked pre-polymers to the plasma discharge.

US 2009/0065485 discloses a process for plasma treating a surface, in which a non-equilibrium atmospheric pressure plasma is generated within a dielectric housing having an inlet and an outlet through which a process gas flows from the inlet to the outlet.

US 2014/0042130 discloses a process for plasma treating a substrate comprising applying a radio frequency high voltage to at least one electrode positioned within a dielectric housing having an inlet and an outlet while causing a process gas, usually comprising helium, to flow from the inlet past the electrode to the outlet, thereby generating a non-equilibrium atmospheric pressure plasma. An atomized or gaseous surface treatment agent is incorporated in the non-equilibrium atmospheric pressure plasma. The substrate is positioned adjacent to the plasma outlet so that the surface is in contact with the plasma and is moved relative to the plasma outlet.

WO 2016/198857 A1 teaches a protective cross-linked polymeric coating for a substrate, obtainable by exposing the substrate to a plasma comprising a monomer compound and a cross-linking reagent. The document discloses in an example a coating obtained from a 1H,1H,2H,2H-perfluorooctyl acrylate monomer compound and a cross-linking reagent from a list comprising, amongst other examples, 1,3-divinyl tetramethyldisiloxane (DVTMDS).

WO 2003/086030 A1 teaches a method of forming a coating on a powdered substrate. The document discloses that a siloxane-organic copolymer can be formed on the powdered substrate surface by use of a mixture of organic and silicon-containing monomers. The document discloses a first list of organic-coating forming materials comprising, amongst other examples, fluoroalkyl(meth)acrylates. The document further discloses a second list of silicon-containing materials including silanes (for example, silane, alkylsilanes, alkylhalosilanes, alkoxysilanes) and linear (for example, polydimethylsiloxane) and cyclic siloxanes (for example, octomethylcyclotetrasiloxane), including organofunctional linear and cyclic siloxanes (for example, Si—H containing, halo-functional, and haloalkyl-functional linear and cyclic siloxanes, e.g. tetramethylcyclotetrasiloxane and tri(nonofluorobutyl)trimethylcyclotrisiloxane). The document discloses in an example a coating on rice hull ash obtained from tetramethylcyclotetrasiloxane.

The water contact angle of the coatings presented above is typically rather low. In addition to the hydrophobicity of the coating, the durability and mechanical resistance are of importance as well, and in particular the combination of a high resistance to abrasive constraints with a high elasticity of the coating. The abovementioned documents do not disclose particular coating compositions or means to achieve all of these properties with a single process.

There remains a need in the art for an improved superhydrophobic coating and a method for the deposition thereof.

The present invention aims to resolve at least some of the problems mentioned above.

SUMMARY OF THE INVENTION

In a first aspect, the present invention provides a method for depositing a coating on a substrate, according to claim 1.

In a second aspect, the present invention provides a substrate coating, according to claim 14.

The present invention is advantageous as it provides for a mechanically durable superhydrophobic coating. The coating comprises nano-ordered domains, coupling areas with high hardness and sections with soft lattices. The nano-ordered domains are homogeneously dispersed and randomly oriented. The coating comprises a high resistance to abrasive constraints as well as a high elasticity.

DESCRIPTION OF FIGURES

FIG. 1 shows a schematic representation of a dielectric barrier discharge system for the soft plasma polymerization of the first and second precursors according to a preferred embodiment of the present invention.

FIG. 2 shows a schematic representation of a coating according to the prior art, formed by a method in which the first and second precursors are alternatingly injected in the treatment region.

FIG. 2) and a coating according to the present invention (cfr. FIG. 3).

DETAILED DESCRIPTION OF THE INVENTION

Figure 3:
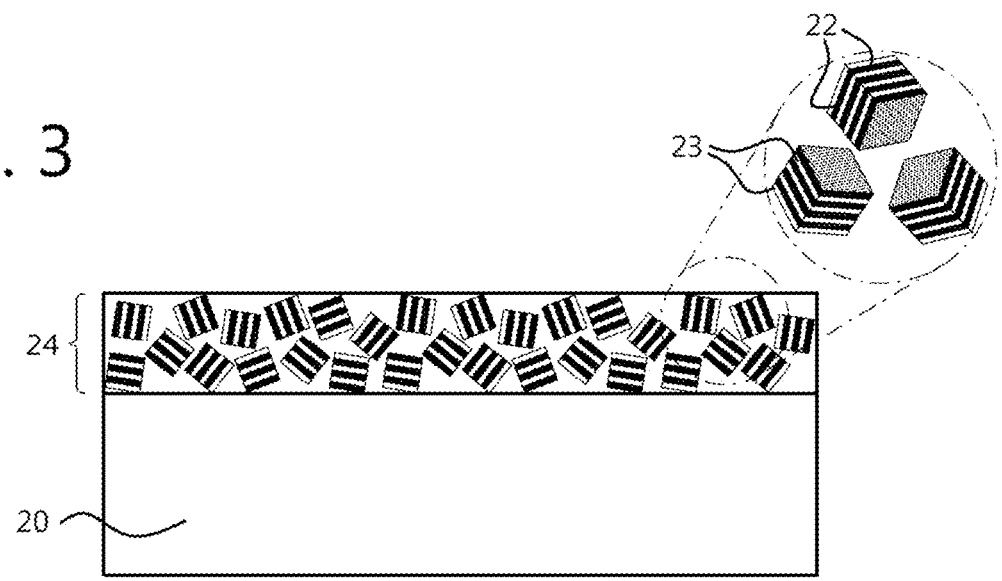
FIG. 3 shows a schematic representation of a coating according to the present invention, comprising nano-ordered domains, which couple areas with high hardness and sections with soft lattices.

The present invention concerns a method for depositing a coating on a substrate and the resulting substrate coating. The invention had been summarized in the corresponding section above. In what follows, the invention is described in detail, preferred embodiments are explained, and the invention is illustrated by means of examples.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

As used herein, the following terms have the following meanings:

"A", "an", and "the" as used herein refers to both singular and plural referents unless the context clearly dictates otherwise. By way of example, "a compartment" refers to one or more than one compartment.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed invention. However, it is to be understood that the value to which the modifier "about" refers is itself also specifically disclosed.

"Comprise", "comprising", and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, element, members, steps, known in the art or disclosed therein.

The recitation of numerical ranges by endpoints includes all numbers and fractions subsumed within that range, as well as the recited endpoints.

The expression "% by weight", "weight percent", "% wt" or "wt %", here and throughout the description unless otherwise defined, refers to the relative weight of the respective component based on the overall weight of the formulation.

The term "standard liter per minute" (slm) as used herein is a unit of volumetric flow rate of a gas corrected to standardized conditions of temperature and absolute pressure. These standardized conditions comprise 0 degrees Celcius and 1 bar as reference point.

In a first aspect, the present invention pertains to a method for depositing a coating on a substrate. A first precursor comprising fluoro-acrylate monomers, fluoro-alkyl acrylate monomers, fluoro-methacrylate monomers, fluoro-alkyl methacrylate monomers, fluoro-silane monomers, or a combination or derivates thereof is provided. A second precursor comprising linear siloxanes, silane monomers, cyclosiloxanes, cyclosilane monomers, or a combination or derivates thereof is provided. The method comprises the steps of co-injecting said first and second precursors in a treatment region; and creating an atmospheric pressure or reduced pressure plasma discharge in said treatment region to deposit a coating derived from said co-injected first and second precursors on said substrate. The substrate is thereto at least partially inserted in the treatment region.

In a second aspect, the present invention pertains to a substrate coating obtained by the first aspect of the present invention. The substrate coating comprises alternated multi-stacked nanostructures. The substrate coating is formed by copolymerization of said first precursor and said second precursor. Preferably, said alternated multi-stacked nanostructures of said substrate coating are in essence randomly oriented and in essence homogeneous in terms of dispersion.

The present invention is advantageous as it provides for a mechanically durable superhydrophobic coating. The coating comprises nano-ordered domains, coupling areas with high hardness and sections with soft lattices. The nano-ordered domains are preferably homogeneously dispersed and randomly oriented. This results in a coating comprising a high resistance to abrasive constraints and a high elasticity. This is furthermore achieved by a single deposition process.

The coating is produced on all or a part of the surface of a substrate by the copolymerization of the first and the second precursor using an atmospheric or reduced pressure discharge, preferably an atmospheric pressure discharge. The plasma may be generated continuously, or in a pulsed mode comprising one or a plurality of cycles comprising a period of time wherein the plasma is generated and a period of time wherein the plasma is not generated. The substrate is brought in the treatment region, after or during which said coating is deposited on the substrate surface.

FIG. 1 shows a schematic representation of a dielectric barrier discharge (DBD) system which, in a preferred embodiment, may be used in the method according to the first aspect of the present invention. In this embodiment, said plasma discharge is a dielectric barrier discharge in which an alternating voltage is applied over the treatment region. The system comprises a first set of electrodes (9) and a second set of electrodes (10). Each set of electrodes comprises at least one electrode, such as one, two, three, four, or more electrodes. The two sets of electrodes are separated by at least one insulating dielectric barrier (12). Preferably, a dielectric barrier is placed in essence adjacent to the top set of electrodes (9). Optionally, a dielectric barrier can be placed in essence adjacent to the bottom set of electrodes (10). The two sets of electrodes thereby define a treatment region (8) or treatment gap, in which a substrate can be provided for treatment. In other words, two sets of electrodes are placed at opposite sides of the treatment region. The substrate inserted in the treatment region (8) may also provide a dielectric barrier, if the substrate material so permits. Preferably, the height of the treatment region, i.e. the gap defined by the electrodes, is at least about 0.1 mm and at most about 10 mm, such as about 0.1 mm, about 0.125 mm, about 0.16 mm, about 0.2 mm, about 0.25 mm, about 0.315 mm, about 0.4 mm, about 0.5 mm, about 0.63 mm, about 0.795 mm, about 1 mm, about 1.26 mm, about 1.58 mm, about 2 mm, about 2.5 mm, about 3.16 mm, about 3.98 mm, about 5 mm, about 6.31 mm, about 7.94 mm, about 10 mm, or any value in between. More preferably, the treatment region comprises a gap of at least about 0.2 mm and at most about 5 mm, even more preferably a gap of at least about 1 mm and at most about 4 mm, such as a gap of about 2 mm. The dielectric barrier (12) material preferably comprises glass, quartz, ceramics, or polymer. Preferably, the dielectric barrier (12) material has a low dielectric loss and a high breakdown strength. Preferably, the electrode material comprises aluminum.

In FIG. 1, the system is schematically represented in a cross section and having the two sets of electrodes (9, 10) in a plane-plane or parallel plate configuration. However, different reactor configurations are possible. One or both of the electrodes may by cylindrical, for example so that the two sets of electrodes are in a coaxial configuration, or may have a wire-plane configuration, or may be in a point-plane configuration.

The system in FIG. 1 further comprises a power source (11) for providing a high voltage alternating current (AC voltage; alternating voltage) over the two sets of electrodes (9, 10). The system is hence configured for providing an alternating voltage over the treatment region. The bottom set of electrodes (10) is preferably earthed and the power source (11) providing the AC voltage is preferably connected to the top set of electrodes (9). The power density over the two sets of electrodes, i.e. the power density of the plasma discharge, is preferably at least 0.05 W·cm$^{-2}$. The power density over the two sets of electrodes, i.e. the power density of the plasma discharge, is preferably at most 100 W·cm$^{-2}$, more preferably at most 50 W·cm$^{-2}$, even more preferably at most 20 W·cm$^{-2}$, yet even more preferably at most 10 W·cm$^{-2}$, and most preferably at most 5 W·cm$^{-2}$. Preferably, said alternating voltage comprises an amplitude of at most 50 kV, more preferably an amplitude of at least 1 kV and at most 20 kV, such as an amplitude of about 1 kV, about 1.26 kV, about 1.58 kV, about 2 kV, about 2.5 kV, about 3.16 kV, about 3.98 kV, about 5 kV, about 6.31 kV, about 7.94 kV, about 10 kV, about 12.6 kV, about 15.8 kV, about 20 kV, or any value in between. Preferably, said alternating voltage comprises a frequency of at least 500 Hz and at most 100 kHz, such as about 500 Hz, about 631 Hz, about 794 Hz, about 1 kHz, about 1.26 kHz, about 1.58 kHz, about 2 kHz, about 2.5 kHz, about 3.16 kHz, about 3.98 kHz, about 5 kHz, about 6.31 kHz, about 7.94 kHz, about 10 kHz, about 12.6 kHz, about 15.8 kHz, about 20 kHz, about 25 kHz, about 31.6 kHz, about 39.8 kHz, about 50 kHz, about 63.1 kHz, about 79.4 kHz, about 100 kHz, or any value in between. More preferably, said alternating voltage comprises a frequency of at least 500 Hz and at most 4.5 kHz, even more preferably a frequency of at least 750 Hz and at most 3 kHz, even more preferably still a frequency of at least 1 kHz and at most 2.25 kHz, such as a frequency of about 1 kHz, about 1.25 kHz, about 1.5 kHz, about 1.75 kHz, about 2 kHz, or about 2.25 kHz. Most preferably, said alternating voltage comprises a frequency of about 1.5 kHz. These numerical specifications are so-called soft plasma conditions or a so-called soft plasma polymerization regime, i.e. plasma process conditions that afford a controlled polymerization with a selective activation of polymerization sites while preserving other chemical functions of the first and second precursor monomers.

In a preferred embodiment, the plasma generated in the dielectric barrier discharge is considered as being a cold plasma, i.e. with a plasma temperature or adjacent surface temperature below 100° C. Preferably, the discharge is performed at room temperature.

In the dielectric barrier system shown in FIG. 1, a plasma gas can be inserted (1) via an inlet in the treatment region (8). Said first (2) and said second (5) precursors can be introduced in the plasma gas, preferably in monomeric form, and preferably before the plasma gas enters the treatment region (8). The system can thereto comprise a means (not shown) to transport the plasma gas to the treatment region (8).

Each of the first and second precursors (2, 5) can be introduced into the plasma gas in either a liquid form, atomized or nebulized, or in a vaporized form. If, before being introduced in the plasma gas, the first and/or second precursor is not in a liquid or gas form at room temperature, it has to be transformed in a liquid or a gas before being introduced in the plasma gas. Each of the first and second precursors may be introduced into the plasma gas continuously or discontinuously. In a preferred embodiment, the first and second precursors (2, 5) are introduced in the plasma gas in the form of an aerosol (4, 7). Preferably, the system thereto comprises an aerosol generator (3, 6) for each of said first and second precursors (2, 5).

In a preferred embodiment, the first and second precursors are co-injected in said treatment region at an in essence constant flow rate of each of said first and said second precursors. This results in an in essence uniform coating. Preferably, each of the first precursor and second precursors is atomized at a rate of at least 0.1 standard liter per minute (slm) and at most 5 slm, such as about 0.1 slm, about 0.125 slm, about 0.16 slm, about 0.2 slm, about 0.25 slm, about 0.315 slm, about 0.4 slm, about 0.5 slm, about 0.63 slm, about 0.795 slm, about 1 slm, about 1.26 slm, about 1.58 slm, about 2 slm, about 2.5 slm, about 3.16 slm, about 3.98 slm, about 5 slm, or any value in between. More preferably, each of the first precursor and the second precursor is atomized at a rate of at least 0.2 slm and at most 2 slm.

In an alternative preferred embodiment, the first and second precursors are co-injected in said treatment region at a decreasing flow rate of the second precursor and an increasing flow rate of the first precursor. This results in a coating comprising a composition gradient. Said flow rate of said second precursor may be linearly decreased during a time span, preferably from a first maximum flow rate to an in essence zero or negligible flow rate. Said flow rate of said first precursor may be linearly increased during said time span, preferably from an in essence zero or negligible flow rate to a second maximum flow rate.

Alternatively, said decrease and increase may be performed according to a stepwise profile, the stepwise profile comprising:

a first time span during which only the second precursor is injected;

a second time span during which the flow rate of the first precursor is increased, and optionally during which the flow rate of the second precursor is decreased;

a third time span during which the flow rates of each of the first and the second precursor are nonzero and in essence constant;

a fourth time span during which the flow rate of the second precursor is decreased, and optionally during which the flow rate of the first precursor is further increased; and a fifth time span during which only the first precursor is injected.

Each of said first, third, and fifth time span may be left out of said stepwise profile. All of these variants of the stepwise profile result in a superhydrophobic coating comprising:

a first polymer layer comprising solely or mainly the second precursor on the inner coating surface;

a second polymer layer comprising solely or mainly the first precursor on the outer exposed coating surface; and a co-polymer region in between the first and second polymer layers.

In a preferred embodiment, said plasma gas comprises helium (He), argon (Ar), nitrogen gas ($N_2$), air, oxygen ($O_2$), ammonia ($NH_3$), methane ($CH_4$), acetylene ($C_2H_2$), carbon dioxide ($CO_2$), hydrogen gas ($H_2$), or a mixture thereof. More preferably, said plasma gas comprises helium (He) or argon (Ar). In a preferred embodiment, said plasma gas comprises a gas flow rate of at least 1 slm and at most 100 slm, such as about 1 slm, about 1.26 slm, about 1.58 slm, about 2 slm, about 2.5 slm, about 3.16 slm, about 3.98 slm, about 5 slm, about 6.3 slm, about 7.95 slm, about 10 slm, about 12.6 slm, about 15.8 slm, about 20 slm, about 25 slm, about 31.6 slm, about 39.8 slm, about 50 slm, about 63 slm, about 79.5 slm, about 100 slm, or any value in between. More preferably, said plasma gas comprises a gas flow rate of at least 5 slm and at most 50 slm, such as a gas flow rate of about 20 slm. A high flow rate of plasma gas is advantageous as it allows to reduce, or to keep to an in essence negligible level of, impurities coming from the atmosphere. In a preferred embodiment, the residence time of the plasma gas in the treatment space is on average at least 0.01 seconds and at most 10 seconds. In a preferred embodiment, the coating is deposited on the substrate surface at a deposition rate of at least 10 nm/minute and at most 500 nm/minute, such as about 10 nm/minute, about 12.6 nm/minute, about 15.8 nm/minute, about 20 nm/minute, about 25 nm/minute, about 31.6 nm/minute, about 39.8 nm/minute, about 50 nm/minute, about 63 nm/minute, about 79.5 nm/minute, about 100 nm/minute, about 126 nm/minute, about 158 nm/minute, about 200 nm/minute, about 250 nm/minute, about 316 nm/minute, about 398 nm/minute, about 500 nm/minute, or any value in between. In a more preferred embodiment, the coating is deposited on the substrate surface at a deposition rate of at least 20 nm/minute and at most 250 nm/minute, even more preferably a deposition rate of at least 50 nm/minute and at most 160 nm/minute, such as a deposition rate of about 50 nm/minute, about 60 nm/minute, about 70 nm/minute, about 80 nm/minute, about 90 nm/minute, about 100 nm/minute, about 110 nm/minute, about 120 nm/minute, about 130 nm/minute, about 140 nm/minute, about 150 nm/minute, about 160 nm/minute, or any value in between.

The first precursor comprises at least one of the following polymerisable monomers or a derivative thereof: a fluoro-acrylate monomer, a fluoro-alkyl acrylate monomer, a fluoro-methacrylate monomer, a fluoro-alkyl methacrylate monomer, and a fluoro-silane monomer. The first precursor may hence comprise one of these polymerisable monomers or a derivative thereof; or multiple of these polymerisable monomers or a derivative thereof.

In a preferred embodiment, said first precursor comprises one or more monomers having the following formula: $CFR_1R_2$—$(CF_2)_n$—$(CR_3R_4)_m$—X. Each of $R_1$ and $R_2$ are, independently of one another, hydrogen, fluorine, a fluoro-alkyl ($C_1$-$C_4$), or $CF_3$. Preferably, n is at least 3 and at most 30. $R_3$ and $R_4$ are, independently of one another and independently of $R_1$ and $R_2$, hydrogen, an alkyl ($C_1$-$C_4$), or a hydroxyl. Preferably, m is 1, 2, or 3. X may be O—CO—$CR_5$=$CHR_6$, wherein $R_5$ and $R_6$ are, independently of one another and independently of $R_1$, $R_2$, $R_3$, and $R_4$, hydrogen or a methyl group. Alternatively, X may be Y—Si—$(R_7)_3$, wherein Y is oxygen or nothing and $R_7$ is, independently of $R_1$, $R_2$, $R_3$, and $R_4$, an alkoxy group.

In a more preferred embodiment, the first precursor comprises one or more monomers from the following polymerisable monomers: 1H,1H-perfluorohexyl acrylate; 1H,1H,5H-octafluoropentyl acrylate; 1H,1H-perfluoroheptyl acrylate; 1H,1H,7H-perfluoroheptyl acrylate; 1H,1H-perfluorooctyl acrylate; 1H,1H-perfluorodecyl acrylate; 1H,1H-perfluorododecyl acrylate; 1H,1H,11H-perfluoroundecyl acrylate; 1H,1H,2H,2H-nonafluorohexyl acrylate; 1H,1H,2H,2H-perfluoro-7-methyloctyl acrylate; 1H,1H,2H,2H-perfluorooctyl acrylate; 2-(perfluoro-7-methyloctyl)ethyl acrylate; 1H,1H,2H,2H-perfluorodecyl acrylate; eicosafluoro-11-(trifluoromethyl)dodecyl acrylate; 1H,1H,2H,2H-perfluorododecyl acrylate; 3-(perfluoro-3-methylbutyl)-2-hydroxypropyl methacrylate; 3-(perfluoro-5-methylhexyl)-2-hydroxypropyl methacrylate; 1H,1H-perfluorohexyl methacrylate; 1H,1H,5H-octafluoropentyl methacrylate; 1H,1H-perfluoroheptyl methacrylate; 1H,1H,7H-perfluoroheptyl methacrylate; 1H,1H-perfluorodecyl methacrylate; 1H,1H-perfluorododecyl methacrylate; 1H,1H,11H-perfluoroundecyl methacrylate; 1H,1H,2H,2H-nonafluorohexyl methacrylate; 1H,1H,2H,2H-perfluoro-7-methyloctyl methacrylate; 1H,1H,2H,2H-perfluorooctyl methacrylate; 2-(perfluoro-7-methyloctyl)ethyl methacrylate; 1H,1H,2H,2H-perfluorodecyl methacrylate; eicosafluoro-11-(trifluoromethyl)dodecyl methacrylate; 1H,1H,2H,2H-perfluorododecyl methacrylate; di-isopropyl (1H,1H,2H,2H-perfluorodecyl)silane; 1H,1H,2H,2H-perfluoro-octyltriethoxysilane; trichloro(1H,1H,2H,2H-perfluorooctyl)silane; 1H,1H,2H,2H-perfluorooctyltrimetoxysilane; 3,3,3-trifluoropropyltrimethoxysilane; (perfluoroalkyl)ethyl-triethoxysilane; nonafluorohexyl-triethoxysilane; and bis(trifluoropropyl)tetramethyl disiloxane.

In a particularly preferred embodiment, the first precursor comprises a fluoro-alkyl acrylate monomer. In a most preferred embodiment, the first precursor comprises 1H,1H,2H,2H-perfluorodecyl acrylate (PFDA) monomer, see FIG. 4.

The second precursor comprises at least one of the following or a derivative thereof: a linear siloxane, a silane monomer, a cyclosiloxane, and cyclosilane monomer. The second precursor may hence comprise one of these substances or a derivative thereof; or multiple of these substances or a derivative thereof.

In an embodiment, the second precursor may comprise a substance represented by the formula R—$Si(X)_nY_{3-n}$. Each of R and X is, independently of one another, an alkyl group, an aryl group, a substituted alkyl group, a substituted aryl group, an organic group containing a carbon-carbon double bond, an organic group containing a carbon-carbon triple bond, or an epoxy group. Y is hydrogen, a halogen atom, a hydroxyl group, an alkoxy group, or an allyl group. n is an integer equal to 0, 1, 2, or 3. A non-limiting list of examples of R and X includes alkyl groups containing from about 1 to about 30 carbon atoms such as methyl, ethyl, propyl, isopropyl, butyl, sec-butyl, tert-butyl, pentyl, hexyl, heptyl, octyl, dodecyl, cyclohexyl, and the like; halogen substituted alkyl groups containing from about 1 to about 30 carbon atoms such as chloromethylene, trifluoropropyl, tridecafluoro-1,1,2,2-tetrahydrooctyl, and the like. R may comprise aryl groups containing from about 6 to about 60 carbon atoms such as phenyl, alkylphenyl, biphenyl, benzyl, phenylethyl, and the like; halogen substituted aryl groups containing from about 6 to about 60 carbon atoms such as chlorophenyl, fluorophenyl, perfluorophenyl, and the like; hydroxyl substituted aryl groups containing from about 6 to about 60 carbon atoms such as phenol, naphthol, cresol, binaphthal, and the like; alkyl substituted aryl groups of from about 7 to about 60 carbon atoms such as methyl, ethyl, or propyl substituted aryl groups, and the like; aryl groups containing nitrogen atoms such as cynide substituted aryl and amino substituted aryl groups, and five or six membered aromatic groups containing nitrogen atom(s); an organic group containing carbon-carbon double bond(s) of from about 1 to about 30 carbon atoms, such as γ-acryloxypropyl group, γ-methacryloxypropyl group, and vinyl group; an organic group containing carbon-carbon triple bond(s) of from about 1 to about 30 carbon atoms, such as acetylenyl, and the like; an organic group containing epoxy group such γ-glycidoxypropyl group and β-(3,4-epoxycyclohexyl)ethyl group and the like. A non-limiting list of examples of Y includes hydrogen, a halogen atom such as chlorine, bromine, and fluorine; a hydroxyl group; an alkoxy group such as methoxy, ethoxy, isopropoxy, and the like; and an allyl group.

In an embodiment, the second precursor may comprise a cyclic siloxane, and more specifically a cyclopolydisubstitutedsiloxane, represented by the formula [—($R_1R_2$)SiO—]$_z$. Hereby, each of $R_1$ and $R_2$ is, independently of one another, an alkyl group of from about 1 to about 30 carbon atoms, an aryl group of from about 6 to about 60 carbon atoms, or a substituted alkyl group or a substituted aryl group of from about 1 to about 30 carbon atoms. z represents hereby an integer of from about 3 to about 10.

In a preferred embodiment, the second precursor comprises one or more monomers from the following monomers: 1,3-diethenyl-1,1,3,3-tetramethyl-disiloxane; 1,3,5-trimethyl-1,3,5-trivinylcyclotrisiloxane; 2,4,6,8-tetramethyl-2,4,6,8-tetraphenyl cyclotetrasiloxane; 2,4,6,8-tetramethyl-2,4,6,8-tetravinylcyclotetrasiloxane; 2,4,6-trimethyl-2,4,6-triphenylcyclotrisiloxane; 3-(trimethoxysilyl)propylmethacrylate; 3-glycidoxyproplytrimethoxy-silane; benzyltrimethoxysilane; bromophenylsilane; bromophenyltrimethoxysilane; cyanophenylsilane; cyanophenyltrimethoxysilane; cyclohexylmethyldimethoxysilane; decamethylcyclopentasiloxane; decaphenylcyclopentasiloxane; dimethyldimethoxysilane; dimethyl-methylhydrogensiloxane; dimethyl-methylvinylsiloxane; dimethyl-siloxane; diphenyldimethoxysilane; diphenyl di silanol; dodecamethylcyclohexasiloxane; dodecaphenylcyclohexasiloxane; ethyltrimethoxysilane; fluorophenylsilane; fluorophenyltrimethoxysilane; hexamethylcyclotri siloxane; hexaphenylcyclotri siloxane; methyltriethoxysilane; methyltrimethoxysilane; octamethylcyclotetrasiloxane; octaphenylcyclotetrasiloxane; octyltrimethyoxysilane; phenylethyltrimethoxysilane; phenyltrimethoxysilane; propyltrimethoxysilane; p-tolyltrimethoxysilane; tridecafluoro-1,1,2,2-tetrahydrooctyltirmethoxysilane; trifluoropropyltrimethoxysilane; and vinyltrimethoxysilane.

In a particularly preferred embodiment, the second precursor comprises a cyclosiloxane. A non-limiting list of examples of suitable cyclic siloxanes includes 2,4,6,8-tetramethyl-2,4,6,8-tetraphenylcyclotetrasiloxane; 2,4,6,8-tetramethyl-2,4,6,8-tetravinylcyclotetrasiloxane; 2,4,6-trimethyl-2,4,6-triphenylcyclotrisiloxane; 2,4,6-trimethyl-2,4,6-trivinylcyclotrisiloxane; decamethylcyclopentasiloxane; decaphenylcyclopentasiloxane; dodecamethylcyclohexasiloxane; dodecaphenylcyclohexasiloxane; hexamethylcyclotrisiloxane; hexaphenylcyclotrisiloxane; octamethylcyclotetrasiloxane; and octaphenylcyclotetrasiloxane. In a most preferred embodiment, the second precursor comprises 2,4,6,8-tetramethyl-2,4,6,8-tetravinylcyclotetrasiloxane (V4D4), see FIG. 5.

In an embodiment, the method according to the first aspect of the present invention is performed in dynamic conditions, wherein at least a part of the surface of the substrate is exposed a first time to the plasma comprising the first and second precursors, and the treated part of the substrate is exposed to the plasma comprising the first and second precursors at least a second time, preferably many times, within the treatment region. The dynamic disposition conditions comprise the advantage of providing a better coating microstructure and topography, i.e. more homogeneous, and thus better superhydrophobic properties.

Furthermore, the method according to the invention presents the advantage of being a one step process. No curing step, or further curing step, has to be carried out. No additional or post-treatment is necessary to control the roughness and/or the surface chemical composition.

In addition, the method has the advantage of being able to be used on a wide range of substrates. Preferably, the substrate is a sheet. The substrates which may be coated can have a flat surface or a curved surface. The substrate may have various forms and shapes. The substrate to be coated may be a foil, a plate, a film, a woven material, a non-woven material, and the like. The substrate to be coated may comprise a plastic, a silicon, a glass, a metal, a ceramic, and the like.

Preferably, the superhydrophobic coating has a contact angle of at least 150° for water.

The substrate coating according to the second aspect of the present invention may be used as a water repellent surface, a fluid motion control surface, preferably in microfluidics, an anti-icing surface, an anti-sticking surface, an anti-fogging surface or a self-cleaning surface.

The substrate coating presents a surprising morphology. It comprises nano-ordered domains, coupling areas with high hardness and sections with soft lattices. The nano-ordered domains are homogeneously dispersed and randomly oriented. This results in a superhydrophobic coating comprising a high resistance to abrasive constraints and a high elasticity.

The invention is further described by the following non-limiting examples which further illustrate the invention, and are not intended to, nor should they be interpreted to, limit the scope of the invention.

EXAMPLES

Example 1

Consecutive Injection Vs. Co-Injection

In the method according to the first aspect of the present invention, the first and second precursors are co-injected in the treatment region. Therefore, copolymerization of the first and second precursor monomers occurs during the plasma treatment. Furthermore, nano-sized domains are formed, coupling regions with high hardness to regions with soft lattices. The nano-sized domains are in essence homogeneously dispersed and randomly oriented, as is schematically shown in FIG. 3. On the substrate (20) a coating (24) is deposited by means of the method according to the first aspect of the present invention, wherein nano-sized domains are present, and in which hard nano-domains (22) are coupled to soft nano-domains (23), rendering the coating firstly superhydrophobic, secondly highly resistant to abrasive constraints, and thirdly highly elastic.

This has to be contrasted with alternated consecutive injection in the treatment region of the first and second precursors, see FIG. 2, which results in a coating (21) of the substrate (20) comprising alternated consecutive layers (22, 23) on top of the substrate surface, whereby the layers (22, 23) are stacked in essence orthogonal to the treated substrate surface.

Example 2

Coating Comprising PFDA and V4D4 Precursors

Figure 4:
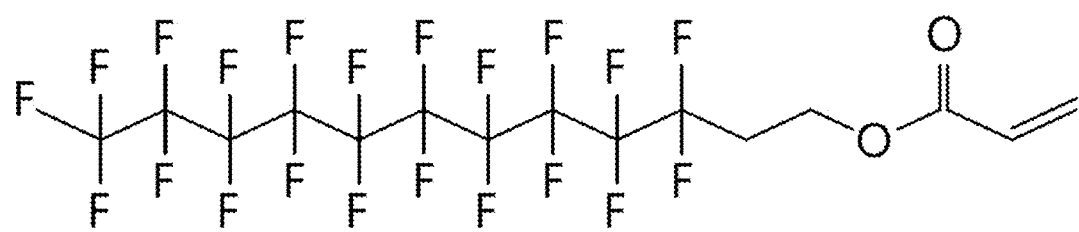
FIG. 4 shows a schematic representation of a 1H,1H,2H,2H-perfluorodecyl acrylate (PFDA) monomer.
Figure 5:
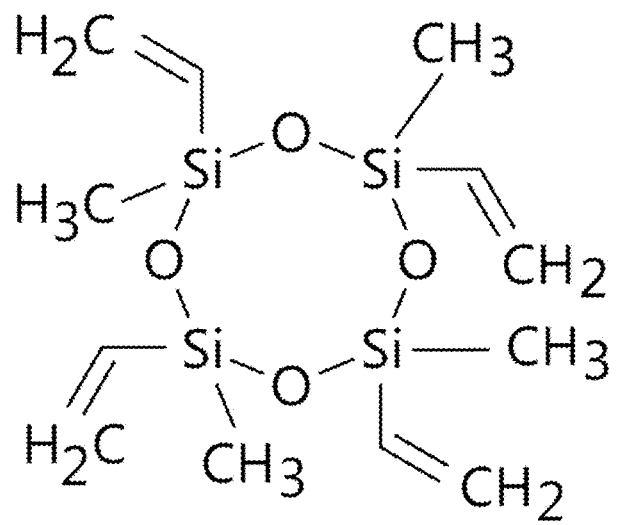
FIG. 5 shows a schematic representation of a 2,4,6,8-tetramethyl-2,4,6,8-tetravinylcyclotetrasiloxane (V4D4) monomer.

In this example, the first precursor comprises 1H,1H,2H,2H-perfluorodecyl acrylate (PFDA; FIG. 4) monomers and the second precursor comprises 2,4,6,8-tetramethyl-2,4,6,8-tetravinylcyclotetrasiloxane (V4D4; FIG. 5) monomers. A dielectric barrier discharge (DBD) system (FIG. 1) has been used, comprising a gap of about 2 mm. The DBD was generated between an earthed bottom aluminum electrode and two high-voltage aluminum electrodes separated by a dielectric barrier material. The plasma discharge was generated by an AC power supply generating a sinusoidal voltage comprising a frequency of about 1.5 kHz. The discharge had a power density of about 0.0625 W/cm$^2$. For the plasma polymerization, atomization of both PFDA and V4D4 was performed in a TSI 3076 device resulting in a precursor flow rate ranging from 0.1 to 5 slm. The precursors were brought in a plasma gas comprising He or Ar and comprising a flow rate of about 20 slm. A deposition rate of about 100 nm/minute was achieved. The gas mixture containing the precursor aerosol was injected directly into the soft plasma in the treatment region. The deposition by plasma discharge was carried out at atmospheric pressure and at room temperature. The treatment has been performed in dynamic mode. The calibration of both co-injected monomers has been obtained by using mass spectrometry analyses performed on the coating material.

Figure 6:
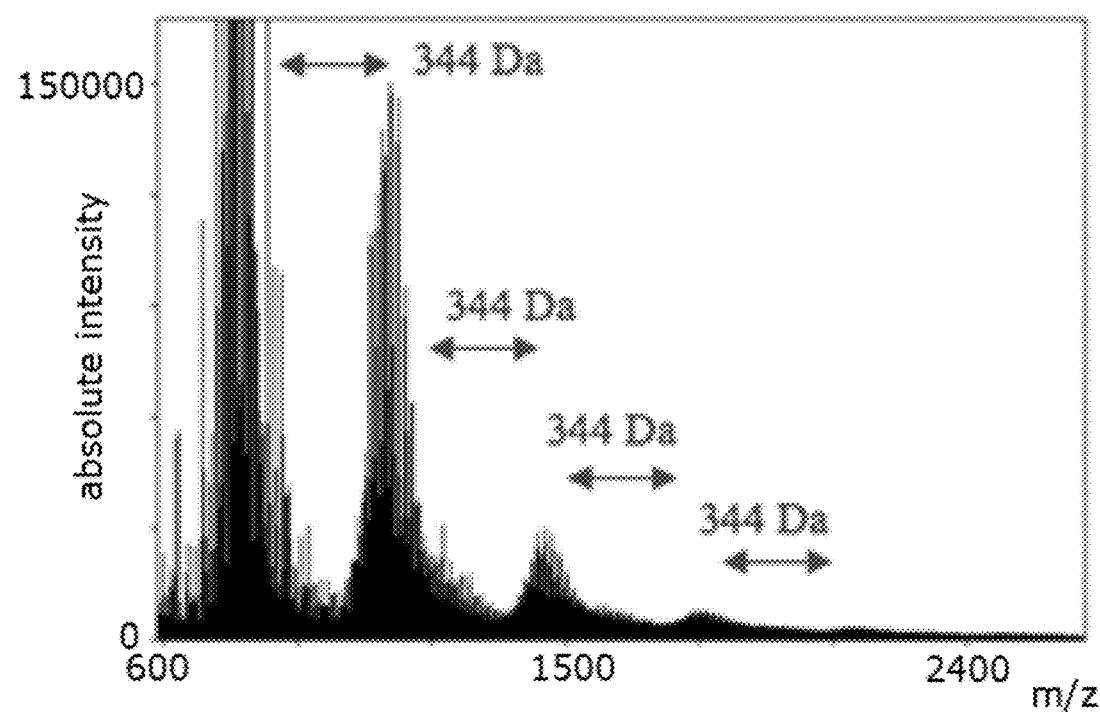
FIG. 6 shows a MALDI mass spectrum performed on pristine V4D4 plasma polymers.
Figure 7:
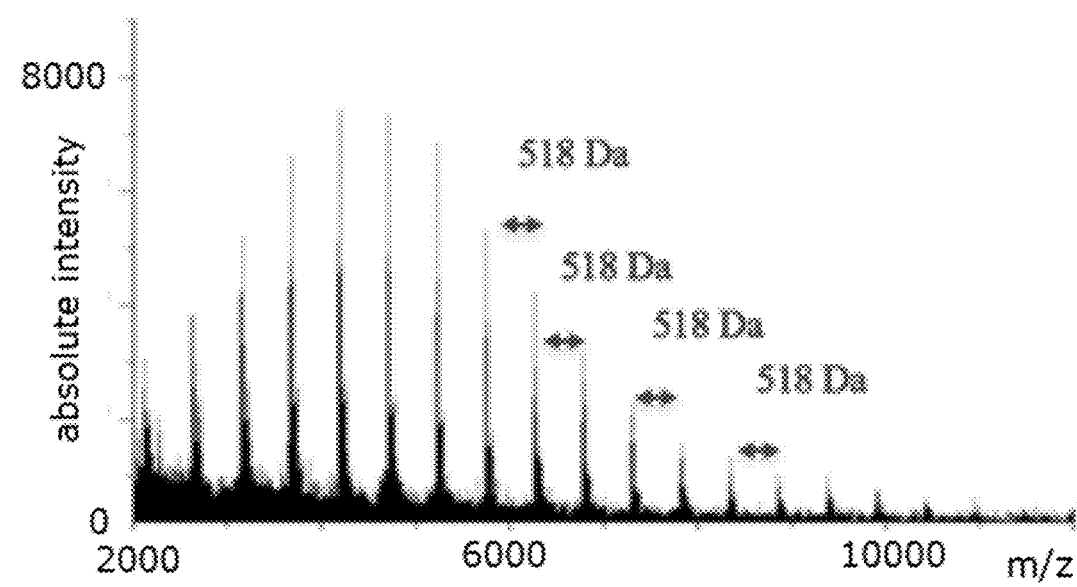
FIG. 7 shows a MALDI mass spectrum performed on pristine PFDA plasma polymers.
Figure 8:
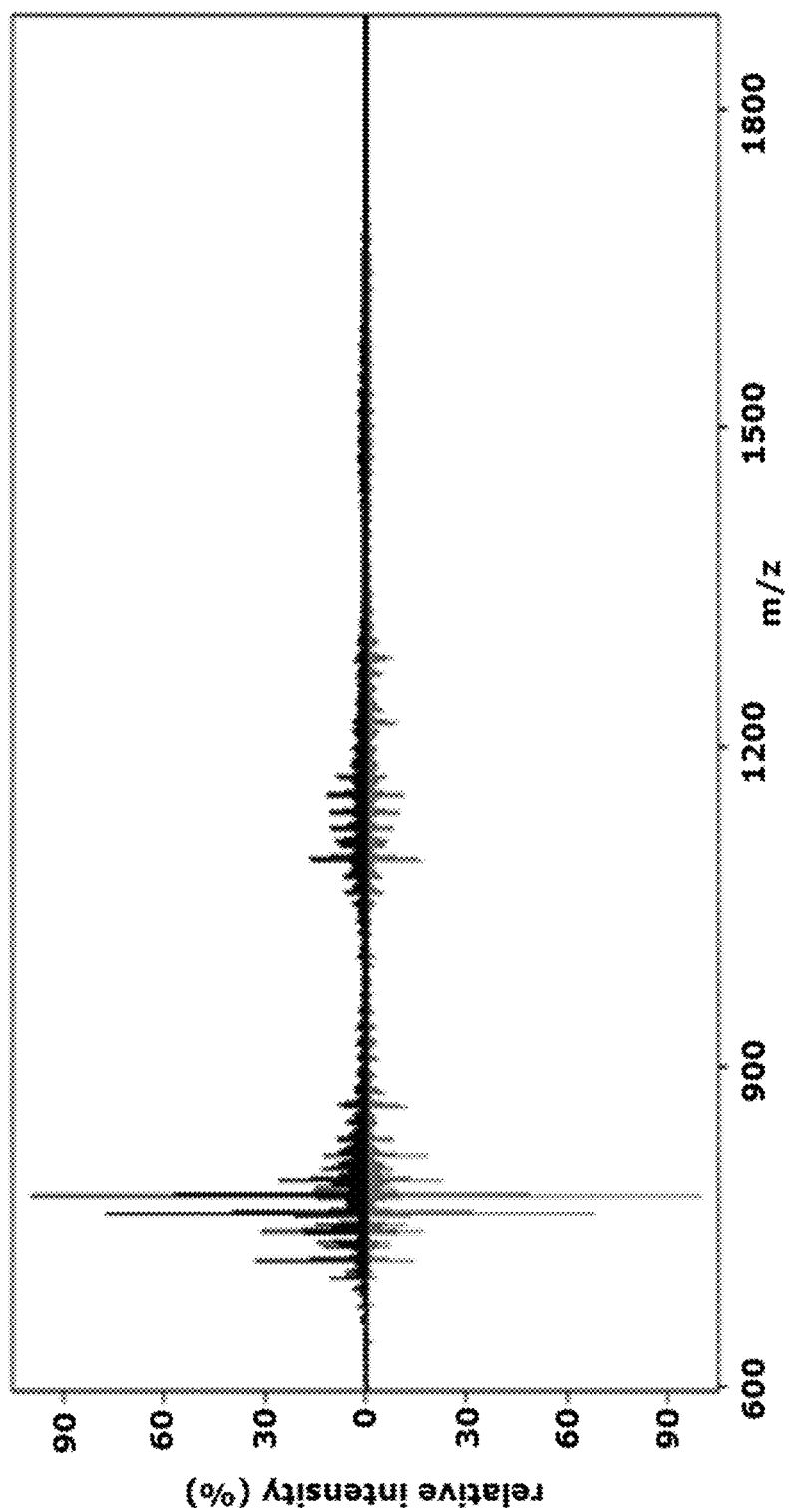
FIG. 8 shows a comparison of MALDI mass spectra of a multilayer structure comprising alternating layers (cfr.

FIG. 6 shows a MALDI mass spectrum performed on pristine V4D4 plasma polymers. FIG. 7 shows a MALDI mass spectrum performed on pristine PFDA plasma polymers. FIG. 8 shows a comparison of MALDI mass spectra of a multilayer structure comprising alternating layers (cfr. FIG. 2; top half of FIG. 8) and a coating according to the present invention (cfr. FIG. 3; bottom half of FIG. 8). In spite of slight intensity variations, all peaks obtained for the multilayer structure can also be observed for the coating according to the present invention. In both cases, copolymerization occurs. In the coating according to the present invention, copolymerization results in randomly oriented nanodomains.

Water contact angles can be adjusted by modulating the mixture of introduced monomers and the plasma conditions. Water contact angle measurements have been performed and yielded contact angles from 150° up to 170°.

Figure 9:
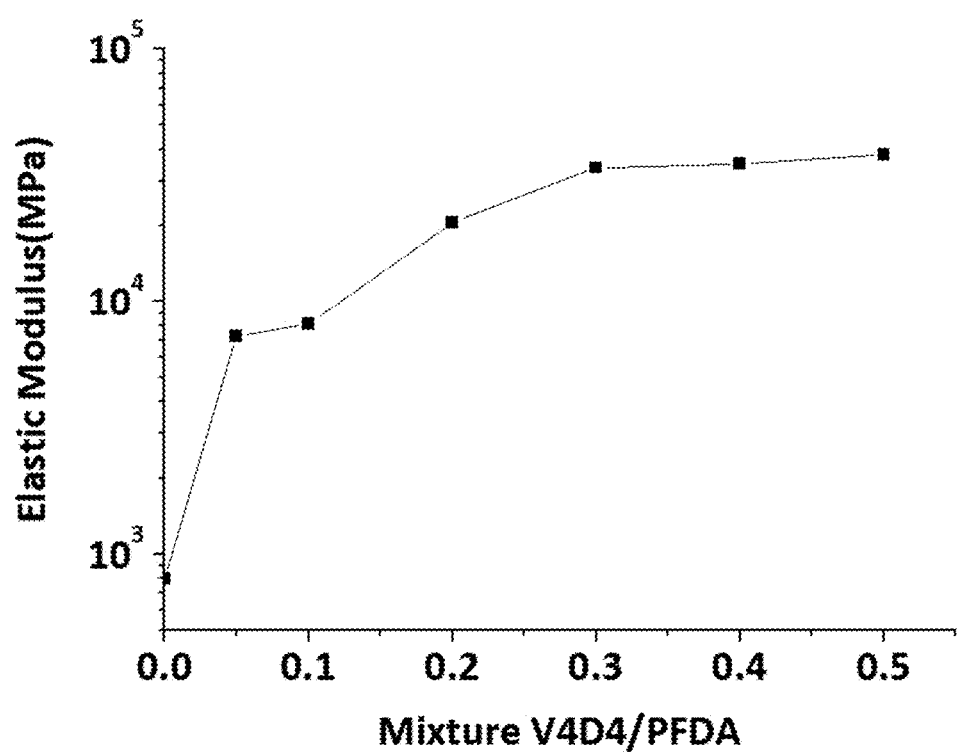
FIG. 9 shows the change of elastic modulus of a coating according to the present invention as a function of monomer content.

The mechanical properties of the coating according to the present invention can be adjusted by modulating the mixture of introduced monomers. FIG. 9 shows the increase of the elastic modulus as a function of increasing V4D4 content. The obtained elastic moduli are significantly larger than for multilayer coatings according to the prior art, with otherwise similar characteristics.

The invention claimed is:

1. A method for depositing a superhydrophobic coating on a substrate, comprising the steps of:
    providing a first precursor comprising fluoro-acrylate monomers, fluoro-alkyl acrylate monomers, fluoro-methacrylate monomers, fluoro-alkyl methacrylate monomers, fluoro-silane monomers, or a combination or derivates thereof, and introducing said first precursor into a plasma gas in a vaporized form using a first aerosol generator;
    providing a second precursor comprising cyclosiloxanes, and introducing said second precursor into the plasma gas in a vaporized form using a second aerosol generator;
    introducing the plasma gas comprising said first and second precursors in a treatment region, thereby co-injecting said first and second precursors in the treatment region; and
    creating an atmospheric pressure plasma discharge in said treatment region to deposit a superhydrophobic coating derived from said co-injected first and second precursors on said substrate, whereby the plasma discharge comprises a power density of at least 0.05 W·cm$^{-2}$ and at most 100 W·cm$^{-2}$.

2. The method according to claim 1, wherein the second precursor comprises a cyclopolydisubstitutedsiloxane represented by the formula [—(R1R2)SiO-]z, whereby each of R1 and R2 is, independently of one another, an alkyl group of from 1 to 30 carbon atoms, an aryl group of from 6 to 60 carbon atoms, or a substituted alkyl group or a substituted aryl group of from about 1 to about 30 carbon atoms, and wherein z is an integer of from 3 to 10.

3. The method according to claim 2, wherein the second precursor comprises 2,4,6,8-tetramethyl-2,4,6,8-tetravinyl-cyclotetrasiloxane monomers.

4. The method according to claim 1, wherein the substrate is a sheet.

5. The method according to claim 1, wherein the superhydrophobic coating comprises a water contact angle of at least 150°.

6. The method according to claim 1, wherein the plasma discharge is a dielectric barrier discharge in which an alternating voltage is applied over the treatment region.

7. The method according to claim 1, wherein said plasma gas comprises helium, argon, nitrogen gas, air, oxygen, ammonia, methane, acetylene, carbon dioxide, hydrogen gas, or a mixture thereof.

8. The method according to claim 7, wherein each of the first and second precursors is atomized at a rate of at least 0.1 standard liter per minute and at most 5-standard liter per minute.

9. The method according to claim 7, wherein said plasma gas comprises a gas flow rate of at least 1 standard liter per minute and at most 100-standard liter per minute.

10. The method according to claim 1, wherein the first precursor comprises a fluoro-alkyl acrylate monomer.

11. The method according to claim 1, wherein said method comprises the step of co-injecting said first and second precursors in said treatment region at a substantially constant flow rate of each of said first and said second precursors to obtain a substantially uniform coating.

12. The method according to claim 1, wherein said method comprises the step of co-injecting said first and second precursors in said treatment region at a decreasing flow rate of said second precursor and an increasing flow rate of said first precursor as to obtain a coating comprising a composition gradient.

13. A method for depositing a superhydrophobic coating on a substrate, comprising the steps of:
- providing a first precursor comprising fluoro-acrylate monomers, fluoro-alkyl acrylate monomers, fluoro-methacrylate monomers, fluoro-alkyl methacrylate monomers, fluoro-silane monomers, or a combination or derivates thereof;
- providing a second precursor comprising cyclosiloxanes;
- co-injecting said first and second precursors in a treatment region at a decreasing flow rate of said second precursor and an increasing flow rate of said first precursor as to obtain a coating comprising a composition gradient; and
- creating an atmospheric pressure or reduced pressure plasma discharge in said treatment region to deposit a superhydrophobic coating derived from said co-injected first and second precursors on said substrate, whereby the plasma discharge comprises a power density of at least $0.05$ $W \cdot cm^{-2}$ and at most $100$ $W \cdot cm^{-2}$.

* * * * *